United States Patent
Wu

(10) Patent No.: US 6,730,962 B2
(45) Date of Patent: May 4, 2004

(54) METHOD OF MANUFACTURING AND STRUCTURE OF SEMICONDUCTOR DEVICE WITH FIELD OXIDE STRUCTURE

(75) Inventor: Xiaoju Wu, Irving, TX (US)

(73) Assignee: Texas Instruments Incorporated, Dallas, TX (US)

( * ) Notice: Subject to any disclaimer, the term of this patent is extended or adjusted under 35 U.S.C. 154(b) by 20 days.

(21) Appl. No.: 10/013,088

(22) Filed: Dec. 7, 2001

(65) Prior Publication Data

US 2003/0109112 A1 Jun. 12, 2003

(51) Int. Cl.$^7$ .......................... H01L 29/76; H01L 29/94
(52) U.S. Cl. ........................ 257/336; 257/344; 257/493
(58) Field of Search ................ 257/335, 336, 257/339; 438/197, 218, 225

(56) References Cited

U.S. PATENT DOCUMENTS

| | | | | |
|---|---|---|---|---|
| 5,406,110 A | * | 4/1995 | Kwon et al. | 257/335 |
| 5,514,608 A | * | 5/1996 | Williams et al. | 438/286 |
| 5,627,394 A | * | 5/1997 | Chang et al. | 257/336 |
| 5,846,866 A | | 12/1998 | Huang et al. | 438/306 |
| 6,160,290 A | * | 12/2000 | Pendharkar et al. | 257/339 |
| 6,252,278 B1 | | 6/2001 | Hsing | 257/335 |
| 6,424,005 B1 | * | 7/2002 | Tsai et al. | 257/335 |
| 6,468,837 B1 | * | 10/2002 | Pendharkar et al. | 257/336 |
| 6,521,946 B2 | * | 2/2003 | Mosher | 257/336 |

OTHER PUBLICATIONS

R. Zhu et al., Implementation of High–Side, High–Voltage Resurf LDMOS in a Sub–half Micron Smart Power Technology. Jun. 2001, Proceding of 2001 International Symposium on Power Semiconductor devices & ICs, pp. 403–406.*

C.Y. Tsai et al. 16–60V Rated LDMOS Show Advanced Performance in an 0.72 Micron Evolution BiCMOS Power Technology. 1997, IEEE, pp. 367–370.*

* cited by examiner

*Primary Examiner*—Wael Fahmy
*Assistant Examiner*—Anh Duy Mai
(74) *Attorney, Agent, or Firm*—Yingsheng Tung; Wade James Brady, III; Frederick J. Telecky, Jr.

(57) ABSTRACT

A method of forming a semiconductor device includes forming a body region of a semiconductor substrate and forming a drift region adjacent at least a portion of the body region. A dopant is used to form the drift region. The dopant may comprise phosphorous. The method also includes forming a field oxide structure adjacent a portion of the drift region and a portion of a drain region. The field oxide structure is located between a gate electrode region and the drain region and is spaced apart from the gate electrode region. Atoms of the dopant accumulate adjacent a portion of the field oxide structure, forming an intermediate-doped region adjacent a portion of the field oxide structure. The method includes forming a gate oxide adjacent a portion of the body region and forming a gate electrode adjacent a portion of the gate oxide.

10 Claims, 3 Drawing Sheets

METHOD OF MANUFACTURING AND STRUCTURE OF SEMICONDUCTOR DEVICE WITH FIELD OXIDE STRUCTURE

TECHNICAL FIELD OF THE INVENTION

This invention relates generally to semiconductor devices and, more specifically, to a semiconductor device with a field oxide structure and a method of manufacturing the same.

BACKGROUND OF THE INVENTION

Many high power applications require the use of high voltage semiconductor devices, such as a drain extended metal oxide semiconductor (DEMOS), because of their lower specific resistance, faster switching speed and lower gate drive power dissipation than their bipolar counterparts. Certain important characteristics of a DEMOS include its specific resistance, its breakdown voltage as well as its safe operation area (SOA). It is desirous to have a lower specific resistance and a higher breakdown voltage. The breakdown voltage of a DEMOS may be improved by adjusting the drift region of the device. A semiconductor device having a drift region with a doping concentration that increases towards the drain region would have a higher breakdown voltage.

In some conventional semiconductor devices, the drift region has a uniform doping concentration between a gate electrode and a drain implant of the device. Furthermore, the formation of some conventional semiconductor devices are susceptible to misalignment in silicide block and drain implant masking steps, which produce large variations in breakdown voltage and specific resistance.

SUMMARY OF THE INVENTION

The present invention provides a semiconductor device and method for manufacturing the same that substantially eliminates or reduces at least some of the disadvantages and problems associated with previously developed semiconductor devices and methods for manufacturing the same.

In accordance with a particular embodiment of the present invention, a method of forming a semiconductor device includes forming a body region of a semiconductor substrate and forming a drift region adjacent at least a portion of the body region. A dopant is used to form the drift region. In a particular embodiment, the dopant may comprise phosphorous. The method also includes forming a field oxide structure adjacent a portion of the drift region and a portion of a drain region. The field oxide structure is located between a gate electrode region and the drain region and is spaced apart from the gate electrode region. Atoms of the dopant accumulate adjacent a portion of the field oxide structure, forming an intermediate-doped region adjacent a portion of the field oxide structure. The method includes forming a gate oxide adjacent a portion of the body region and forming a gate electrode adjacent a portion of the gate oxide.

In accordance with another embodiment, a semiconductor device includes a body region of a semiconductor substrate and a drift region adjacent at least a portion of the body region. The drift region comprises a dopant. In a particular embodiment, the dopant may comprise phosphorous. The semiconductor device includes a field oxide structure adjacent a portion of the drift region and a portion of a drain region. The field oxide structure is located between a gate electrode region and the drain region and is spaced apart from the gate electrode region. The semiconductor device also includes an intermediate-doped region adjacent a portion of the field oxide structure. The intermediate-doped region comprises dopant atoms accumulated proximate the field oxide structure. The semiconductor device includes a gate oxide adjacent a portion of the body region and a gate electrode adjacent a portion of the gate oxide.

Technical advantages of particular embodiments of the present invention include a semiconductor device with a doping concentration that increases moving laterally from a drift region to a drain implant. Accordingly, the Kirk effect on the semiconductor device is suppressed and the safe operation area (SOA) of the device is improved.

Another technical advantage of particular embodiments of the present invention includes a semiconductor device having a field oxide structure adjacent a portion of a drain region. Thus, there is greater tolerance for misalignment during doping of a drain implant and a silicide block process. Accordingly, there is a reduced need for overdesign of the device with larger dimensions and reduced specific resistance.

Other technical advantages will be readily apparent to one skilled in the art from the following figures, descriptions and claims. Moreover, while specific advantages have been enumerated above, various embodiments may include all, some or none of the enumerated advantages.

BRIEF DESCRIPTION OF THE DRAWINGS

For a more complete understanding of particular embodiments of the invention and their advantages, reference is now made to the following descriptions, taken in conjunction with the accompanying drawings, in which.

DETAILED DESCRIPTION OF THE INVENTION

Figure 1:
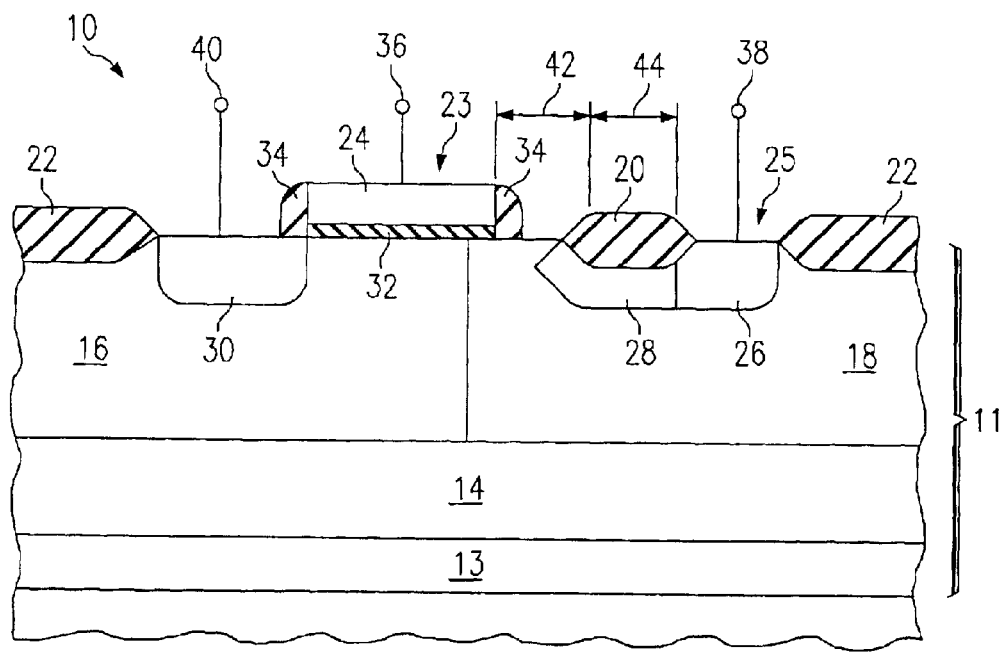
FIG. 1 is a cross-sectional diagram illustrating a semiconductor device with a field oxide structure at one stage of a manufacturing process, in accordance with a particular embodiment of the present invention.

FIG. 1 illustrates a semiconductor device at one stage of a manufacturing process, in accordance with a particular embodiment of the present invention. Semiconductor device 10 is a high powered, drain extended metal oxide semiconductor (DEMOS) of negative-type, or a DENMOS. Semiconductor device 10 includes a field oxide structure 20 adjacent a portion of a drift region 18 and a drain region 25 of semiconductor device 10. Field oxide structure 20 is located between a gate electrode region 23, which includes a gate electrode 24, and drain region 25. Field oxide structure 20 is spaced apart from gate electrode 24.

Drift region 18 is a lightly doped region of negative-type ("N type") and is formed using a phosphorous dopant. Once field oxide structure 20 is formed adjacent a portion of drift region 18, phosphorous atoms segregate out of field oxide structure 20 and accumulate at the interface between the field oxide and the silicon of drift region 18, thus creating an intermediate-doped region 28 adjacent a portion of field oxide structure 20. Drain region 25 includes a drain implant 26 which is a heavily doped region.

The presence of field oxide structure 20 creates a doping concentration of semiconductor device 10 that increases from drift region 18 to drain region 25, since the presence of field oxide structure 20 creates intermediate-doped region 28, and intermediate-doped region 28 is between drift region 18 and drain region 25. Such an increase suppresses the Kirk effect, or base push out at high current, on semiconductor device 10 and thus improves the safe operation area (SOA) of semiconductor device 10, because the breakdown voltage increases. The SOA includes the combinations of drive current and drain voltage at which the device may be operated without burnout. Furthermore, semiconductor device 10 also has a lower specific resistance. Semiconductor device 10 also has better misalignment tolerance during doping of drain implant 26 and silicide block process as a result of the presence of field oxide structure 20 since field oxide structure 20 acts as a mask or block during such processes. Other advantages to the formation of field oxide structure 20 of semiconductor device 10 in accordance with particular embodiments of the present invention are discussed below, while further advantages will be readily apparent to one skilled in the art.

Semiconductor device 10 includes semiconductor substrate 11 which comprises a wafer 13. As discussed in further detail below, in this embodiment semiconductor substrate 11 also includes a body region 16 disposed adjacent a portion of a buried layer 14. Isolation structures 22 are adjacent portions of semiconductor substrate 11. Semiconductor device 10 also includes source/back gate implant 30. Gate electrode 24 is disposed upon a gate oxide 32, and spacer structures 34 are adjacent gate electrode 24. Semiconductor device 10 also includes gate contact 36, drain contact 38 and source/back gate contact 40.

Figure 2:
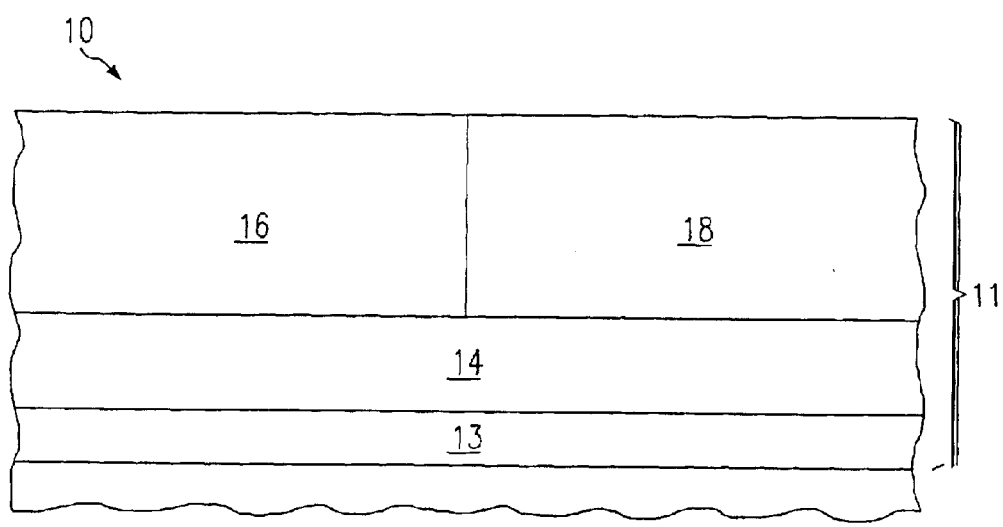
FIG. 2 is a cross-sectional diagram illustrating a semiconductor device with a body region, a drift region and a buried layer at one stage of a manufacturing process, in accordance with a particular embodiment of the present invention.

FIG. 2 illustrates semiconductor device 10 at one stage of a manufacturing process, in accordance with an embodiment of the present invention. Semiconductor substrate 11 comprises wafer 13, which is formed from a single crystalline silicon material. Semiconductor substrate 11 may comprise other suitable materials or layers without departing from the scope of the present invention. For example, semiconductor substrate 11 may include a recrystallized semiconductor material or any other suitable semiconductor material.

In this embodiment, semiconductor device 10 includes buried layer 14. Buried layer 14 is formed within semiconductor substrate 11 using any of a variety of techniques well known to those skilled in the art. In the illustrated embodiment, buried layer 16 is negatively-doped to form a negative buried layer ("NBL"). In an NBL, electrons conduct electricity during operation of semiconductor device 10. Any of a number of dopants may be used to form an NBL, such as arsenic, phosphorus or antimony. Other embodiments may not have a buried layer 16.

Body region 16 and drift region 18 are formed adjacent buried layer 14. Body region 16 is a positive-type ("p type") region. Body region 16 may be formed by any of a variety of techniques known to those skilled in the art, such as epitaxial deposition. Body region 16 may have a depth of approximately 3.5 microns. Drift region 18 is a lightly-doped, N type region formed through implantation of a phosphorous dopant. Semiconductor device 10 may include other regions, such as a standard N type well, P type well and deep N type well. Both a deep N type well and standard N type well may be used as the drift region for a high voltage NMOS.

Figure 3:
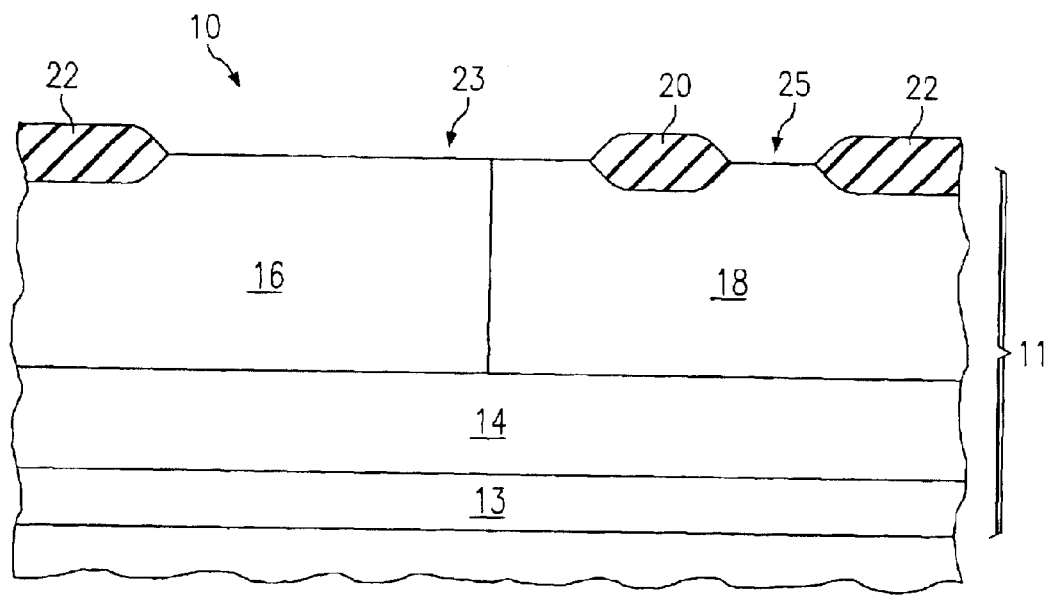
FIG. 3 is a cross-sectional diagram illustrating the semiconductor device of FIG. 2 with a field oxide structure and an isolation structure at another stage of a manufacturing process, in accordance with a particular embodiment of the present invention.

FIG. 3 illustrates semiconductor device 10 of FIG. 2 at a further stage in the manufacturing process. Field oxide structure 20 is formed between gate electrode region 23, where a gate electrode will be subsequently formed, and drain region 25. Field oxide structure 20 is spaced apart from gate electrode region 23 and adjacent a portion of drain region 25. Field oxide structure 20 is also adjacent a portion of drift region 18.

Field oxide structure 20 may be formed by growing a thin pad oxide over semiconductor substrate 11 and depositing a thin nitride layer over the pad oxide. Photoresist is spun on and lithographically patterned to define a field region in which field oxide structure 20 is to be formed. The thin nitride layer is etched in the field region with the pattern photoresist as the etch mask. The pattern photoresist is stripped and the field oxide structure 20 is grown in the field region with the pattern nitride as an oxidation barrier.

Local oxidation on silicon (LOCOS) isolation structure 22 is formed to isolate areas of semiconductor device 10. LOCOS isolation structure 22 may be formed using the same process and at approximately the same time as field oxide structure 20. As illustrated, field oxide structure 20 and LOCOS isolation structure 22 substantially surround drain region 25.

Figure 4:
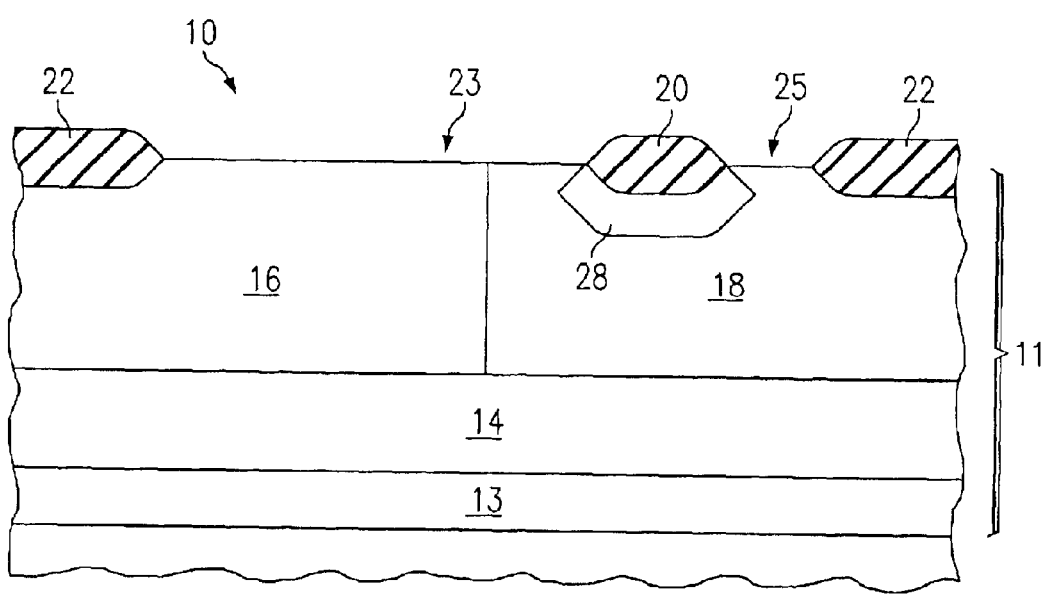
FIG. 4 is a cross-sectional diagram illustrating the semiconductor device of FIG. 3 with an intermediate-doped region, in accordance with a particular embodiment of the present invention.

FIG. 4 illustrates semiconductor device 10 of FIG. 3 having an intermediate-doped region 28. The formation of field oxide structure 20 adjacent a portion of drift region 18, causes phosphorous atoms to segregate out of field oxide structure 20 and accumulate at the interface between the field oxide and the silicon of drift region 18, around field oxide structure 20. This segregation creates intermediate-doped region 28 adjacent a portion of field oxide structure 20.

Referring back to FIG. 1, semiconductor device 10 of FIG. 4 is illustrated at a further stage in the manufacturing process. A doping process is used to form a heavily-doped drain implant 26 of N+ type. Semiconductor device 10 has an N type doping concentration that increases moving laterally from drift region 18 (a lightly-doped region) to intermediate-doped region 28 to drain implant 26 (a heavily-doped region). The increasing doping concentration may be approximately linear with respect to the lateral distance from drain region 18 (see FIG. 5). This lateral increase in doping concentration increases the breakdown voltage (the voltage at which the semiconductor device will break down at high current operation) of the device. Thus, the Kirk effect on semiconductor device 10 at high current is suppressed, and the SOA of semiconductor device 10 is improved. The specific resistance of semiconductor device 10 is decreased as well.

The presence of field oxide structure 20 also gives semiconductor device 10 increased tolerance for misalignment during doping processes of drain implant 26 and the silicide block process at drain region 25 since field oxide structure 20 may act as a mask or block during such processes. Therefore, there is less need for overdesign of semiconductor device 10.

Semiconductor device 10 of FIG. 1 also includes source/back gate implant 30 adjacent body region 16. Source/back gate implant 30 includes an N+ type region. Gate electrode 24 is disposed upon gate oxide 32 at gate electrode region 23.

Field oxide structure 20 has a width 44, and field oxide structure 20 is located a distance 42 from gate electrode 24. Width 44 and distance 42 may be varied to achieve a certain length of intermediate-doped region 28 relative to the distance of drift region 18 between gate electrode 24 and drain implant 26 depending on characteristics such as the application, use and doping concentrations of semiconductor device 10. Such variations may improve the performance of semiconductor device 10.

Spacer structures 34 are formed adjacent edges of gate electrode 24. Spacer structures 34 comprise a nitride material; however, spacer structures in other embodiments may comprise other materials. Drain contact 38 is formed at drain region 25, and gate contact 36 is formed at gate electrode region 23. Source/back gate contact 40 is formed proximate source/back gate implant 30.

Other standard processing steps can be undertaken in the manufacturing of semiconductor device 10. Such processing steps may include the formation of dielectric portions, silicide portions, threshold voltage implants, other implant regions and other layers and/or structures known to those skilled in the art. Other appropriate metal interconnections may be formed, and passivation may be undertaken. Other appropriate methods or steps may be performed to complete the manufacturing of semiconductor device 10.

Figure 5:
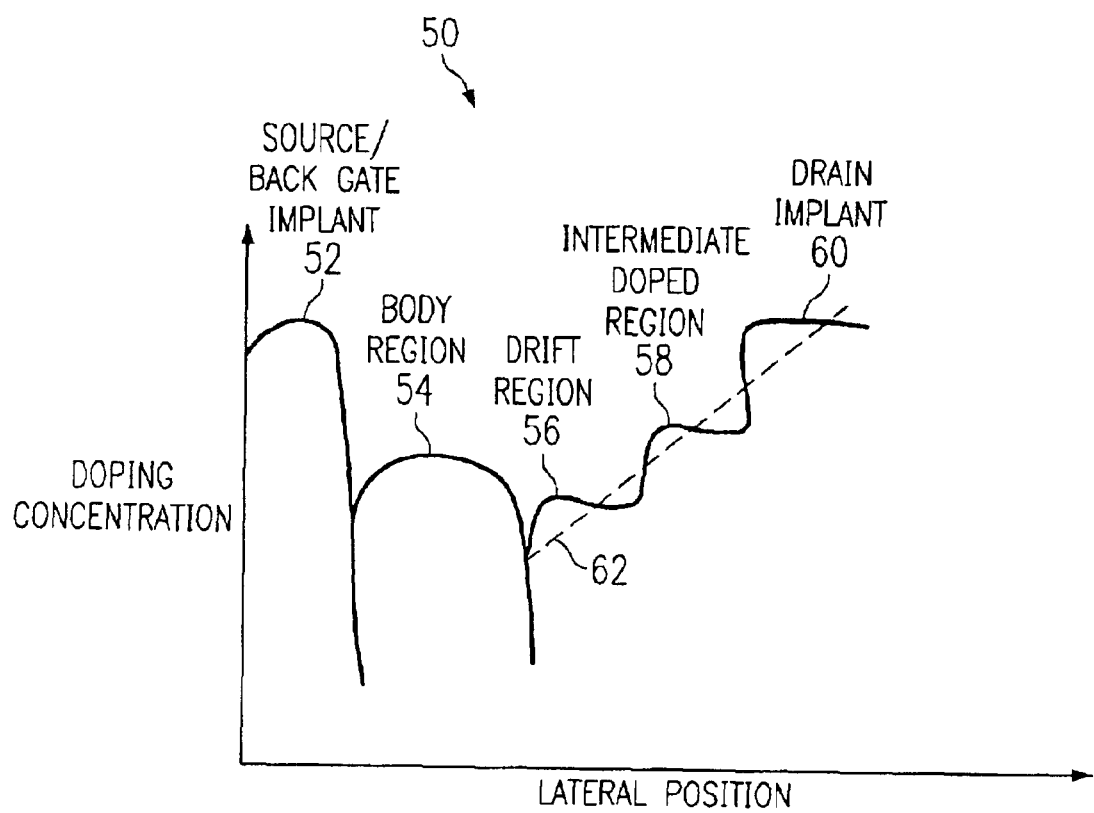
FIG. 5 is a plot of doping concentration at varying lateral positions of a semiconductor devices, in accordance with a particular embodiment of the present invention.

FIG. 5 illustrates a plot 50 of the doping concentration moving laterally along a semiconductor device manufactured in accordance with an embodiment of the present invention. The doping concentration of a source/back gate implant of the semiconductor device is illustrated at section 52, and the doping concentration of a body region is illustrated at section 54. Section 56 illustrates the doping concentration of a drift region, section 58 illustrates the doping concentration of an intermediate-doped region, and section 60 illustrates the doping concentration of a drain implant region of the semiconductor device.

As discussed above, an intermediate-doped region develops from the segregation of phosphorous atoms from a field oxide structure of the semiconductor device and the accumulation of such atoms around the field oxide structure. As illustrated, such intermediate-doped region leads to a doping concentration that increases moving laterally from the drift region to the drain implant. Such increase is approximately linear, as evidenced by line 62 passing through the doping concentrations from the drift region to the drain implant.

Although the present invention has been described in detail, various changes and modifications may be suggested to one skilled in the art. It is intended that the present invention encompass such changes and modifications as falling within the scope of the appended claims.

What is claimed is:

1. A semiconductor device, comprising:
    a body region of a semiconductor substrate;
    a drift region adjacent at least a portion of the body region, the drift region comprising a dopant;
    a field oxide structure adjacent a portion of the drift region and a portion of a drain region, wherein the field oxide structure is located between a gate electrode region and the drain region and is spaced apart from the gate electrode region;
    an intermediate-doped region adjacent a portion of the field oxide structure, the intermediate-doped region comprising dopant atoms accumulated proximate the field oxide structure;
    a gate oxide adjacent a portion of the body region; and
    a gate electrode adjacent a portion of the gate oxide.

2. The semiconductor device of claim 1, wherein the dopant comprises phosphorous.

3. The semiconductor device of claim 1, wherein the intermediate-doped region has a higher doping concentration than a doping concentration of the drift region.

4. The semiconductor device of claim 1, further comprising a drain implant at the drain region, the drain implant having a higher doping concentration than a doping concentration of the intermediate-doped region.

5. The semiconductor device of claim 1, further comprising a buried layer of the semiconductor substrate, wherein the buried layer is adjacent a portion of the body region.

6. The semiconductor device of claim 1, further comprising a local oxidation on silicon (LOCOS) isolation structure adjacent a portion of the drain region.

7. The semiconductor device of claim 1, further comprising a spacer structure adjacent a portion of the gate electrode.

8. The semiconductor device of claim 1, further comprising a drain contact at the drain region, the drain contact operable to facilitate a flow of electric current through the semiconductor device.

9. The semiconductor device of claim 1, wherein the drift region has a first dopant concentration, the intermediate-doped region has a second dopant concentration, and the drain region has a third dopant concentration; and there exists a increment from the first doping concentration to the second doping concentration and a increment from the second doping concentration to the third dopant concentration; and the increments are approximately linear.

10. The semiconductor device of claim 9, wherein the difference between a peak doping concentration in the drift region and a peak doping concentration in the intermediate-doped region is approximately equal to the difference between the peak doping concentration in the intermediate-doped region and the peak doping concentration in the drain region.

* * * * *